United States Patent
Akagawa et al.

(10) Patent No.: US 6,762,412 B1
(45) Date of Patent: Jul. 13, 2004

(54) OPTICAL APPARATUS, EXPOSURE APPARATUS USING THE SAME, AND GAS INTRODUCTION METHOD

(75) Inventors: Masayuki Akagawa, Tokyo (JP); Taichi Taniuchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/564,632

(22) Filed: May 3, 2000

(30) Foreign Application Priority Data

May 10, 1999 (JP) ............................................ 11-129313

(51) Int. Cl.$^7$ .............................. H01K 1/26; H01J 37/00
(52) U.S. Cl. ............................ 250/363.07; 250/492.2; 362/293; 362/96; 362/264; 362/345; 362/373
(58) Field of Search .................... 250/363.07, 492.2; 362/293, 96, 264, 345, 373

(56) References Cited

U.S. PATENT DOCUMENTS

| | | | |
|---|---|---|---|
| 5,430,303 A | * | 7/1995 | Matsumoto et al. ...... 250/492.2 |
| 5,528,118 A | | 6/1996 | Lee |
| 5,602,683 A | | 2/1997 | Straaijer et al. |
| 5,623,853 A | | 4/1997 | Novak et al. |
| 5,696,623 A | | 12/1997 | Fujie et al. .................. 359/350 |
| 5,906,429 A | | 5/1999 | Mori et al. |
| 6,025,115 A | * | 2/2000 | Komatsu et al. ............. 430/313 |
| 6,222,610 B1 | | 4/2001 | Hagiwara et al. |
| 6,268,904 B1 | * | 7/2001 | Mori et al. ............... 250/492.2 |
| 6,288,769 B1 | | 9/2001 | Akagawa et al. |

FOREIGN PATENT DOCUMENTS

EP 1075017 A1 2/2001

OTHER PUBLICATIONS

USPTO publication: US 2001/0026354 A, Optical Instrument, Gas Repalcement Method . . . Oct. 4, 2001.*

* cited by examiner

Primary Examiner—John R. Lee
Assistant Examiner—Zia R. Hashmi
(74) Attorney, Agent, or Firm—Oliff & Berridge, PLC

(57) ABSTRACT

The optical apparatus of the present invention comprises; an optical member such as a lens; a casing containing the optical member; a gas supply device that supplies gas at a predetermined flow rate to inside the casing; and a gas introduction mechanism that reduces the flow rate of the gas supplied to inside the casing to below the predetermined flow rate. The casing has an inlet through which gas is supplied from the gas supply device to the inside. The gas introduction mechanism comprises an impingement member which is disposed between the inlet and a surface of the optical member, and the gas introduced from the inlet impinges against the impingement member. As a result, contamination of the optical member due to gas introduced to inside the casing can be reduced.

18 Claims, 5 Drawing Sheets

US 6,762,412 B1

OPTICAL APPARATUS, EXPOSURE APPARATUS USING THE SAME, AND GAS INTRODUCTION METHOD

BACKGROUND OF THE INVENTION

1. Field of the Invention

The present invention relates to an optical apparatus for containing an optical member in a casing such as a lens-barrel into which nitrogen gas or the like is introduced, an exposure apparatus using the optical apparatus, and a gas introduction method.

2. Description of the Related Art

In conventional exposure apparatus, if oxygen exists in a space through which exposure light in an illumination optical system or in a projection optical system passes, when the exposure light is generated by a light source such as an ArF excimer laser, emission spectrum lines overlap on an area of oxygen absorption spectrum lines. Therefore, a phenomenon occurs where oxygen absorbs the exposure light, causing ozonization.

Therefore, there is a possibility that a tarnishing substance is deposited on the surface of the optical lens, adversely affecting the lens characteristics. Therefore, with conventional exposure apparatus, a part of the whole space around the optical path from the light source to a substrate to be processed is covered with a cover, and the inside of the cover is filled with a gas which is inert with respect to the exposure light, for example, nitrogen gas.

As a means for replacing gas in the optical path with nitrogen gas, for example, a structure as shown in FIG. 7 can be used. That is to say, in a structure where lenses 101 to 103 are clamped by spacing rings 104, 105 and surrounded by a lens-barrel 106, the nitrogen gas is introduced from a piping joint 107 which corresponds to an inflow device for the nitrogen gas. The nitrogen gas passes through an inflow passage 106a in the lens-barrel 106, and flows through a hole 104a opened in the spacing ring 104 to between the lenses 101 and 102 and the lenses 102 and 103. The space between the lenses 101 and 102, and the space between the lenses 102 and 103 are communicated with each other. The nitrogen gas flowing in between the lenses is discharged to the outside from a piping joint 108, passing through an outflow passage 106b having a similar structure.

However, with the above described conventional gas inflow device, the inflow passage 106a of the lens-barrel 106 coincides with the hole 104a of the spacing ring 104, and the nitrogen gas flowing from the hole 104a to between the lenses impinges concentratedly on one spot 102a of the lens 102 lying on an extension line of the hole 104a. Even with clean nitrogen gas, of purity of 99.999%, since dirt in the piping (outgassing of impurities generated by the piping itself) is contained therein, the above described one spot 102a is concentratedly contaminated, and the contamination rate at this spot becomes very high compared to at other places.

SUMMARY OF THE INVENTION

In view of the above situation, it is an object of the present invention to provide an optical apparatus which can reduce contamination on optical members such as lenses or the like due to the inflow gas, an exposure apparatus using the optical apparatus, and a gas introduction method.

To solve the above described problems, the optical apparatus of the present invention contains an optical member in a casing and comprises a gas introduction mechanism that reduces a flow rate of gas at the time of introducing a gas supplied at a predetermined flow rate from a gas supply device to inside the casing, to below the predetermined flow rate.

Moreover, in the gas introduction method of the present invention, when the gas supplied at a predetermined flow rate from the gas supply device is made to flow into the casing containing the optical member, the flow rate of the gas is decreased to below the predetermined flow rate.

According to the optical apparatus and the gas introduction method, when the gas supplied at a predetermined flow rate from the gas supply device is made to flow into the casing, the flow rate of the gas is decreased to below the predetermined flow rate. Therefore, when the gas reaches the surface of the optical member, the flow rate of the gas is decreased, and the gas is easily dispersed. As a result, adhesion of impurities contained in the gas onto the optical member can be suppressed, and the contamination rate of the optical member is retarded, enabling a significant improvement in the life span of the optical member.

The gas introduction mechanism is disposed between an inlet provided in the casing, and the surface of the optical member, and may comprise an impingement member or obstructer against which the gas introduced from the inlet is made to impinge. In this case, since the gas impinges against the impingement member to decrease the speed, adhesion of contained impurities onto the optical member can be suppressed.

The optical apparatus according to a second aspect of the present invention contains an optical member in a casing, and comprises a gas introduction mechanism that dispersingly introduce a gas from a plurality of places around the optical member, at the time of introducing the gas into the casing.

Moreover, with an other gas introduction method of the present invention, when a gas is made to flow into a casing containing an optical member, the gas is dispersed so as to flow from a plurality of places around the optical member.

According to the optical apparatus and the gas introduction method, since the gas is dispersed so as to flow from a plurality of places around the optical member, the place on the surface of the optical member against which the gas impinges is not concentrated at one spot, and the overall flow rate can be decreased compared to a case where the gas is concentratedly made to flow from one place. Therefore, impurities contained in the gas are unlikely to adhere to the optical member. Adhesion of impurities contained in the gas onto the optical member can thus be suppressed, thereby retarding the contamination rate, enabling a significant improvement in the life span of the optical member.

The gas introduction mechanism may comprise an annular member arranged in the casing so as to surround the optical member. In the annular member, there may be formed a circulation groove formed along the circumferential direction, in a face facing an inlet for the gas formed in the casing, and a plurality of through holes which are arranged circumferentially apart from each other so as to communicate with the circulation groove. In this case, the gas can be made to flow via the circulation groove from the plurality of through holes, enabling deceleration and dispersed inflow of the gas with a simple construction.

The through holes may be arranged at positions shifted from the gas inlet. In this case, it is possible to disperse and decelerate the gas introduced from the inlet by letting it impinge against the bottom of the circulation groove without flowing directly into a through hole.

The annular member may be a spacing annular member which is disposed between adjacent optical members and regulates the spacing of these optical members. In this case, the annular member can be formed by merely machining the spacing annular member, and can thus be realized at a low cost without increasing the number of members.

The gas introduction mechanism may have a filter that passes the introduced gas and adsorbs impurities in the gas. In this case, impurities intermixed with the gas in the piping can be removed to improve the gas purity, and further improve the life span of the optical member.

The exposure apparatus of the present invention is an exposure apparatus which guides exposure energy to a mask to thereby form a pattern on the mask onto the surface of a substrate. The apparatus comprises any one of the above-described optical apparatuses, and constitutes, using the optical members in the optical apparatus, at least one of an optical system that guides exposure energy to the mask, and an optical system that guides a pattern to the substrate.

According to the exposure apparatus, since at least one of an optical system that guides exposure energy to a mask, and an optical system that guides a pattern to a substrate, is constituted by the optical members in the above described optical apparatus, adhesion of impurities onto the optical members can be decreased, thereby improving the life span of the lens and reducing the maintenance costs, as well as preventing a decrease in exposure energy such as exposure light or the like, enabling efficient exposure.

DESCRIPTION OF THE PREFERRED EMBODIMENTS

Below is a description of a first embodiment of an optical apparatus, an exposure apparatus using the optical apparatus and a gas introduction method according to the present invention, with reference to FIG. 1 to FIG. 3.

Figure 1:
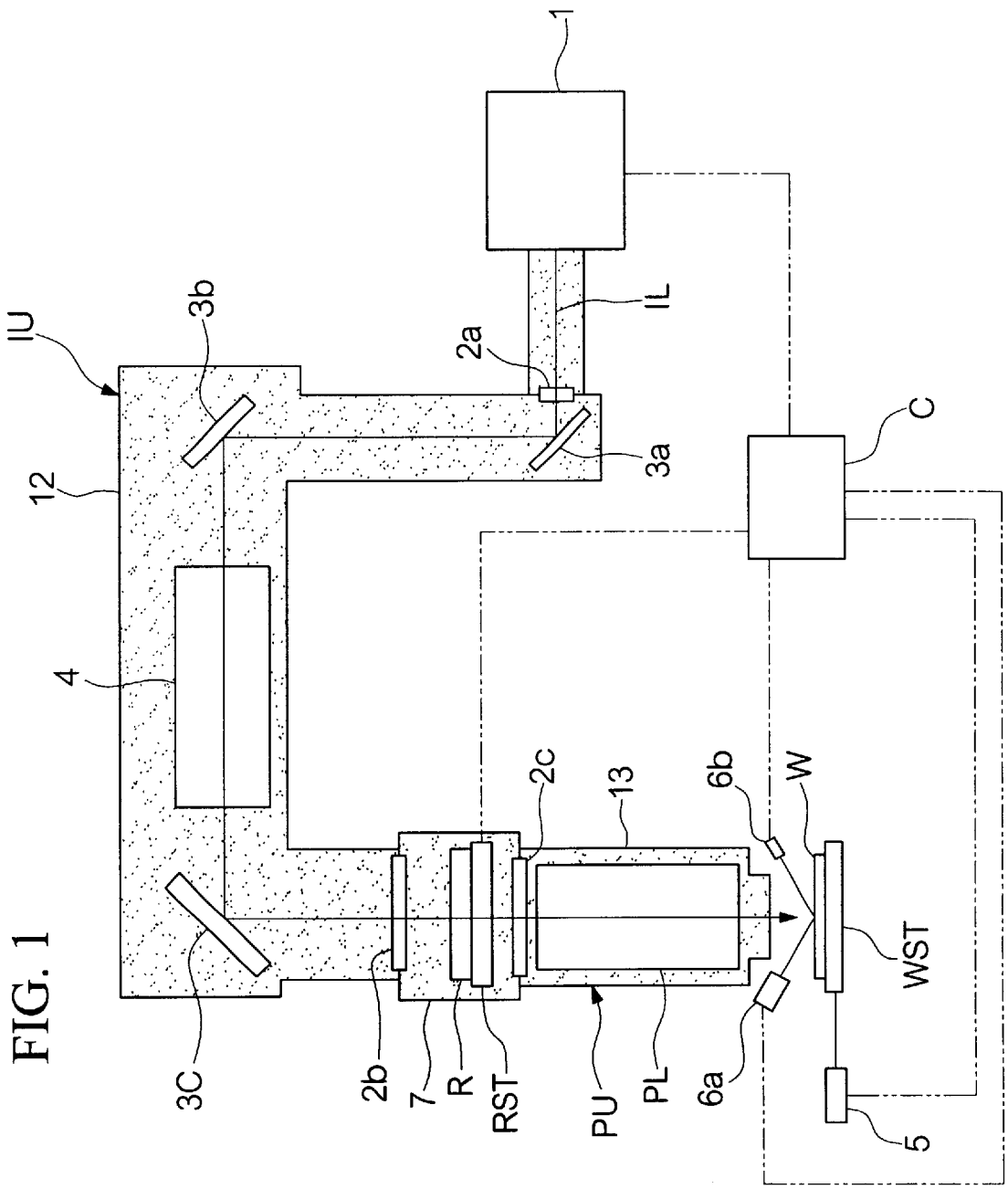
FIG. 1 is a schematic diagram showing a first embodiment of an exposure apparatus of the present invention.

FIG. 1 is a diagram schematically showing the overall construction of an exposure apparatus in this embodiment. An exposure light source 1 irradiates exposure light (exposure energy) IL of far-ultraviolet light (wavelength: 193.4 nm) by means of an ArF excimer laser.

The exposure light IL irradiated from the exposure light source 1 passes through a window portion 2a and impinges on a mirror 3a in an illumination system unit IU. The exposure light IL reflected by the mirror 3a is again reflected by a mirror 3b to enter an illumination optical system 4. Between the exposure light source 1 and the illumination optical system 4, there is provided a beam matching unit including a movable mirror for adjusting the position of the optical path (optical axis) of the exposure light source 1 and the illumination optical system 4.

The illumination optical system 4 has a relay lens, an optical integrator (fly-eye lens or rod lens) for homogenizing the exposure light IL, an input lens for inputting the exposure light IL to the optical integrator, a relay lens for condensing rays of exposure light IL emitted from the optical integrator, and a plurality of lens elements such as a condenser lens or the like.

The exposure light IL emitted from the illumination optical system 4 is reflected by a mirror 3c, passes through a window portion 2b, and incidents on a reticle R supported on a reticle stage RST which is movable in two-dimensional directions. Moreover, the exposure light IL passed through the reticle R enters a projection optical system PL in a projection system unit (optical apparatus) PU through a window portion 2c, passes through a plurality of lens elements constituting the projection optical system PL and then is irradiated on a wafer (substrate) W, to thereby form a pattern image on the reticle R onto the surface of the wafer W. The window portions 2a, 2b and 2c are all a quartz or glass plate comprising fluorite or the like which transmits far ultraviolet rays.

The wafer W is mounted on a wafer stage WST movable in three-dimensional directions (XYZ directions), and the position of the wafer stage in the XY plane is measured by a laser interferometer 5 (in the figure, only one is shown, but actually the laser interferometer is provided respectively for the X axis and the Y axis). The wafer stage WST is moved by stepping based on the measurement value of the laser interferometer 5, and the stepping movement and exposure are repeated in a so-called step-and-repeat method, to thereby sequentially expose a pattern onto the wafer W. Moreover, on the upper side of the wafer stage WST, there are provided a light projecting system 6a and a light receiving system 6b of a focus detection system for optically detecting the height position of the wafer W. In this system, a measurement beam is obliquely irradiated on the surface of the wafer W from the light projecting system 6a and the measurement light reflected by the surface of the wafer W is received by the light receiving system 6b, and the light receiving system 6b outputs signals to a control unit C. The control unit C then detects the height position of the wafer W based on the received photodetecting signal, and moves the wafer stage WST in the height direction to thereby adjust the focal point of the projection optical system PL.

As shown in FIG. 1, the illumination system unit IU and the projection system unit PU have a structure for sealing the optical path of the exposure light IL, from the exposure light source 1 to the window portion 2b, and the optical path of the exposure light IL from the window portion 2c to the lens directly above the wafer W. In addition, the reticle R and the reticle stage RST are sealed with a sealing member 7. That is to say, the dotted area in FIG. 1 is isolated from the outside air. At least a part of the optical path for the wafer W, the wafer stage WST and the interferometer 5 may be sealed with a sealing member to isolate them from the outside air.

Figure 2:
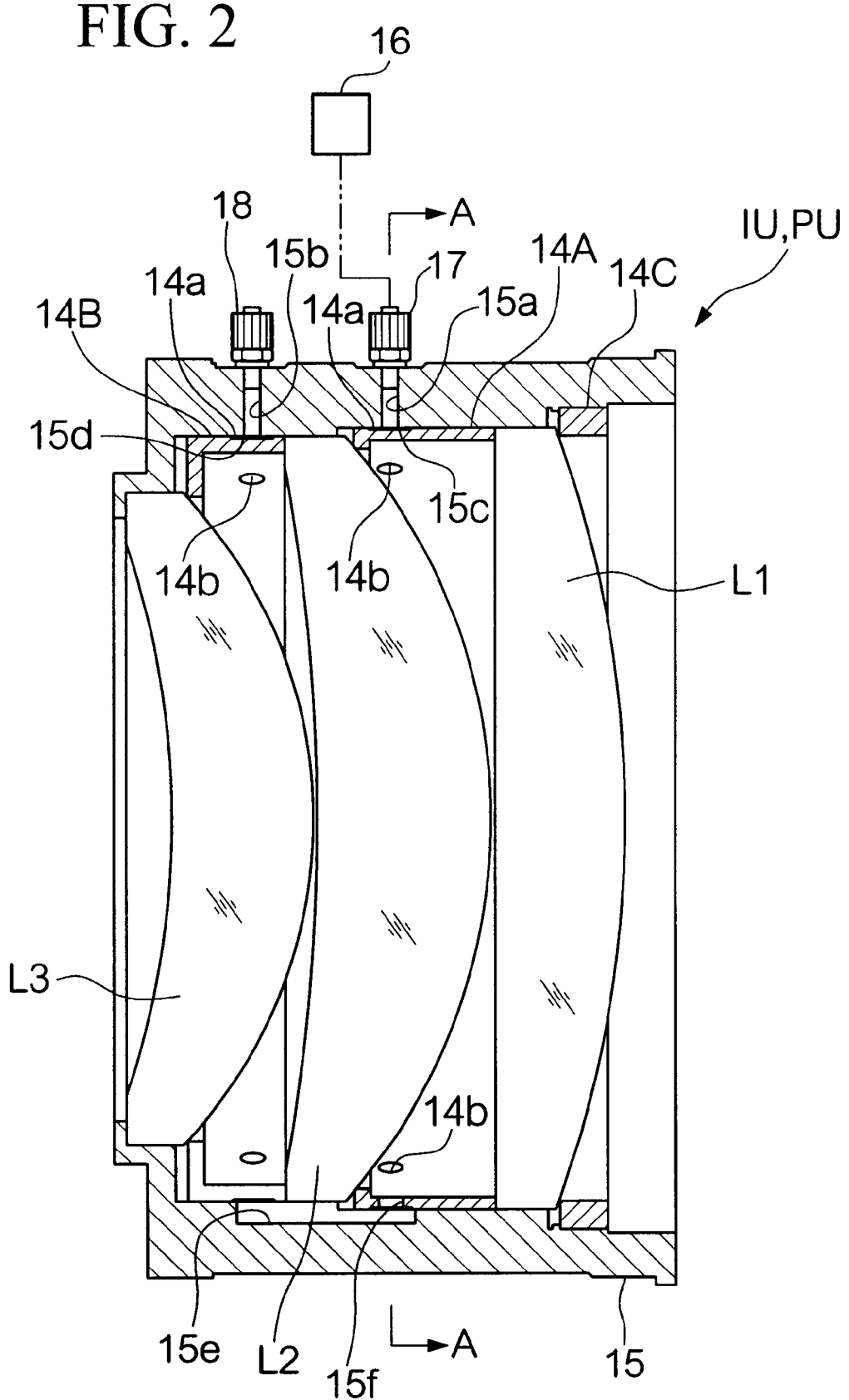
FIG. 2 is a sectional view showing a part of an illumination system unit and a projection system unit in the first embodiment.
Figure 3:
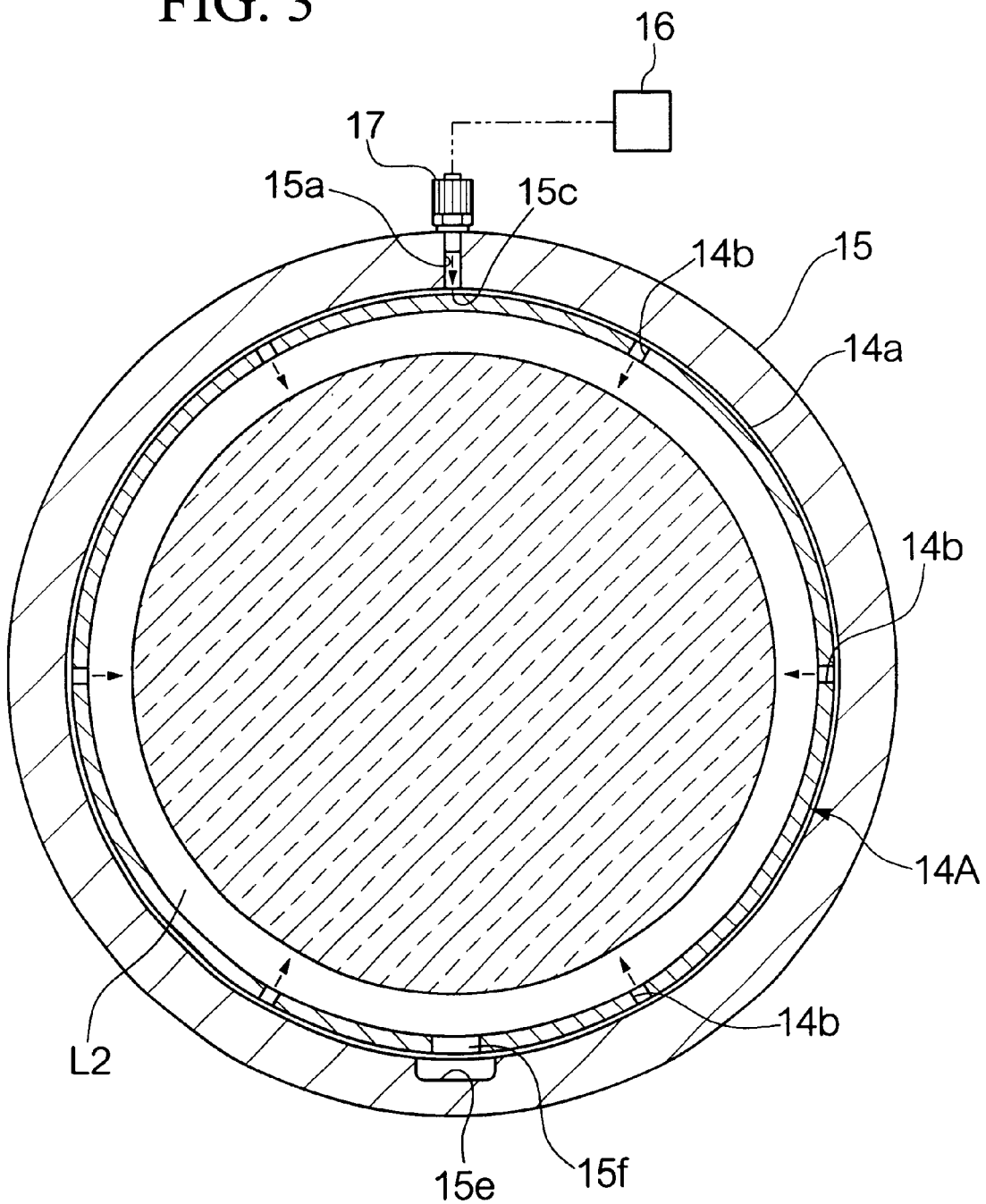
FIG. 3 is a sectional view taken along the line A—A in FIG. 2.

The illumination system unit IU and the projection system unit PU comprise, as shown in FIG. 2 and FIG. 3, lenses L1 to L3 arranged on the optical path of the exposure light IL and constituting a part of a plurality of lens elements in the illumination optical system 4 or the projection optical system PL, spacing rings 14A, 14B and 14C (impingement member, annular member, spacing ring member) disposed between lenses L1 to L3 so as to surround these lenses for regulating the spacing between the respective lenses, a lens-barrel (casing) 15 for containing and holding these, and a gas supply device 16 disposed externally for supplying nitrogen gas to between the lenses L1 to L3. The gas supply device 16 comprises a gas cylinder in which high purity nitrogen gas having, for example, a purity of 99.999% is contained.

On the lens-barrel 15, there are formed an inlet hole 15a for flowing the nitrogen gas to between the lenses, and an outlet hole 15b for discharging the inside nitrogen gas to the outside, respectively pierced radially through the lens-barrel 15. An inflow joint 17 to be connected to the gas supply device 16 is provided at the external opening of the inlet hole 15a, and a discharge joint 18 is provided at the external opening of the outlet hole 15b.

On the spacing rings 14A and 14B, there are respectively formed circulation grooves 14a which are formed around the circumferential direction on outer surfaces facing an inlet 15c and an outlet 15d which are internal openings of the inlet hole 15a and the outlet hole 15b, and a plurality of through holes 14b (six each ring in this embodiment) disposed circumferentially apart from each other with equal spacing, in the circulation grooves 14a. Moreover, these through holes 14b are arranged at a position shifted from the inlet 15c. On the inner circumference of the lens-barrel 15, there is formed a connection groove 15e extending axially from the circulation groove 14a of the spacing ring 14A to the circulation groove 14a of the spacing ring 14B for connecting them. An opening 15f is formed in the spacing ring 14A for communicating the space between the lens L1 and lens L2 with the connection groove 15e.

Next is a description of an introduction method for nitrogen gas in the illumination system unit IU and the projection system unit PU.

At first, the nitrogen gas is introduced from the inflow joint 17 through the inlet hole 15a to the inside of the lens-barrel 15. The nitrogen gas impinges against the bottom of the circulation groove 14a of the spacing ring 14A facing the inlet 15c of the inlet hole 15a, and flows in the circumferential direction using the circulation groove 14a as a flow passage. Since the circulation groove 14a of the spacing ring 14A is on the inside extension line of the inlet hole 15a, the nitrogen gas impinges against the circulation groove 14a and is dispersed in two directions along the circumferential direction, as well as the flow rate decreasing.

The nitrogen gas flowing in the circulation groove 14a flows from the plurality of through holes 14b to between the lens L1 and the lens L2. At this time, since the nitrogen gas is dispersed to flow from the plurality of through holes 14b, the flow rate for each through hole 14b is further decelerated. Therefore, the circulation groove 14a of the spacing ring 14A, and the plurality of through holes 14b serve as a gas introduction mechanism which decreases the flow rate of the nitrogen gas to below a predetermined flow rate, at the time of flowing the nitrogen gas supplied at a predetermined flow rate, into the lens-barrel 15.

The nitrogen gas circulated between the lens L1 and the lens L2 is introduced into the circulation groove 14a of the spacing ring 14B via the opening 15f and the connection groove 15e of the spacing ring 14A. Hence the nitrogen gas circulated in the circulation groove 14a of the spacing ring 14A is also introduced into the circulation groove 14a of the spacing ring 14B via the connection groove 15e, and flows in the circumferential direction along the circulation groove 14a of the spacing ring 14B. Moreover, the nitrogen gas flows from the plurality of through holes 14b disposed in the spacing ring 14B into between the lens L2 and the lens L3. The nitrogen gas circulated between the lens L2 and the lens L3 is discharged to the outside (to a recovery device or the like) from the discharge joint 18 via the through holes 14b or openings for discharge (not shown) provided in the spacing ring 14B, the circulation groove 14a and the outlet hole 15b.

Therefore, according to this embodiment, the nitrogen gas supplied from the gas supply device 16 at a predetermined flow rate is made to flow into the lens-barrel 15, with the flow rate being decreased to below the predetermined flow rate by the circulation groove 14a and the plurality of through holes 14b. Hence at the time of reaching the surface of the lens L2, the flow rate of the nitrogen gas decreases, and the nitrogen gas is easily dispersed, so that impurities contained in the gas are unlikely to adhere to the lens L2.

Furthermore, since the nitrogen gas is dispersed to flow from a plurality of places around the lens L2, the place on the surface of the lens L2 against which the gas impinges is not concentrated at one spot, and the overall flow rate can be decreased compared to the case where the gas is concentratedly made to flow from one place. Hence contained impurities are unlikely to adhere to the lens L2.

As described above, since adhesion of impurities onto the surface of the lens is decreased by means of the nitrogen gas, the cleaning effect due to irradiating the exposure light IL on the lens surface outbalances the adhesion rate, and cleaning is repeated by using the nitrogen gas repeatedly, thereby making it possible to maintain the lens surface always in a good condition.

Second Embodiment

Figure 5:
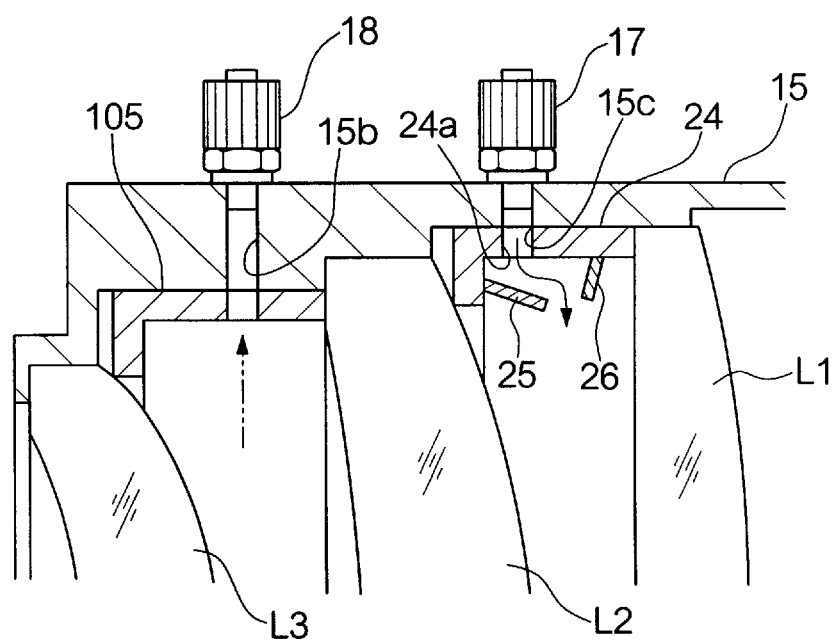
FIG. 5 is a sectional view showing a part of an illumination system unit and a projection system unit in a second embodiment of the present invention.

Next is a description of a second embodiment of the present invention with reference to FIG. 5.

In the first embodiment, the circulation hole 14a and the plurality of through holes 14b are provided in the spacing ring 14A for decelerating the nitrogen gas. On the other hand, in the second embodiment, as shown in FIG. 5, on the inner side of the spacing ring 24, there is provided a first plate member (impingement member) 25 for decreasing the flow rate of the nitrogen gas flowing from the through hole 24a to below the flow rate of the nitrogen gas supplied from the gas supply device 16.

That is to say, in the second embodiment, the first plate member 25 is arranged at a position where the nitrogen gas flowing from the through hole 24a of the spacing ring 24 which coincides with the inlet 15c formed in the lens-barrel 15 directly impinges, and is inclined so that the flow direction of the nitrogen gas is deflected away from the lens L2 side. Therefore, the nitrogen gas flowing from the through hole 24a impinges against the first plate member 25 to be decelerated. Moreover, since the nitrogen gas does not impinge directly against the lens L2, impurities contained in the gas are unlikely to adhere to the lens L2.

Furthermore, the nitrogen gas impinged against the first plate member 25 is guided away from the lens L2 side toward the lens L1 side, and a second plate member 26 may be provided inside of the spacing ring 24, for deflecting the flow direction of the nitrogen gas away from the lens L1 side.

In this case, since the second plate member 26 is disposed so as to change the flow direction of the nitrogen gas from the lens L1 side toward in-between the lens L1 and the lens L2, to prevent the flow of the nitrogen gas toward the lens L1, the surface of the lens L1 is also not tarnished.

Third Embodiment

Figure 6:
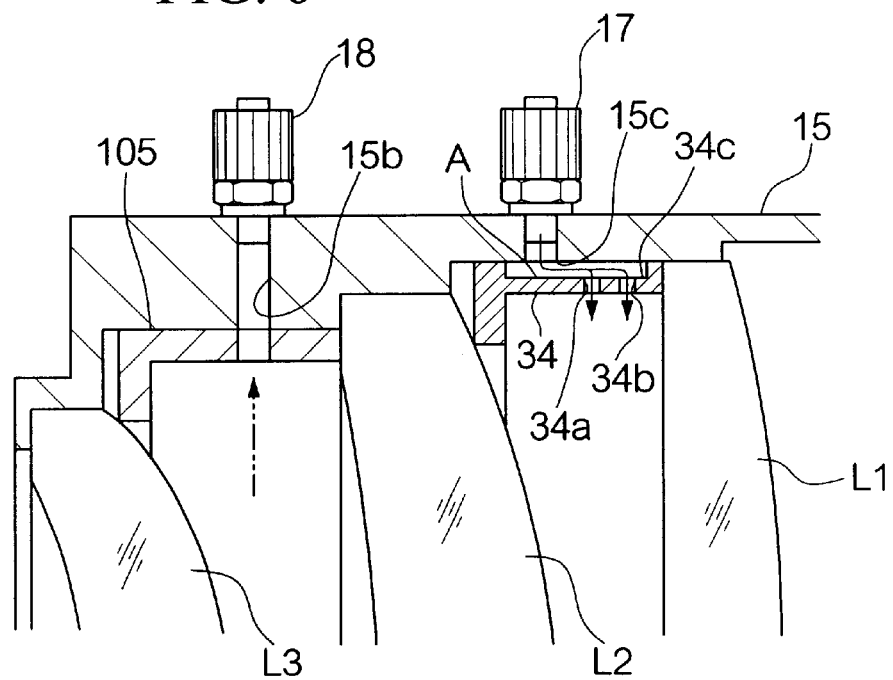
FIG. 6 is a sectional view showing a part of an illumination system unit and a projection system unit in a third embodiment of the present invention.
Figure 7:
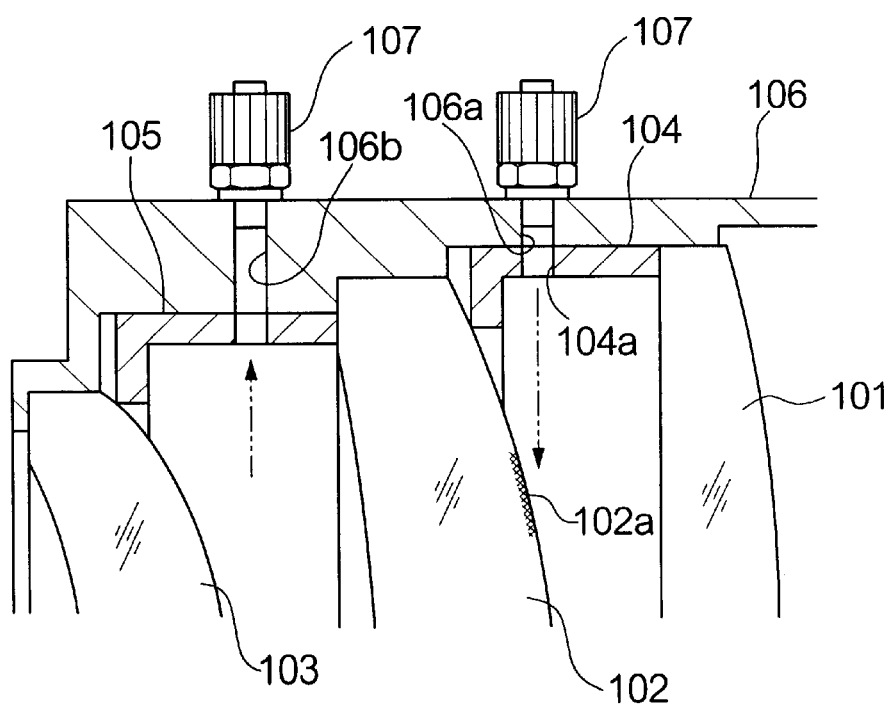
FIG. 7 is a sectional view showing a part of an illumination system and a projection system in a conventional example.

Next is a description of a third embodiment of an optical apparatus, an exposure apparatus using the optical apparatus and a gas introduction method according to the present invention with reference to FIG. 6.

The point that is different between the third embodiment and the first embodiment is that with the first embodiment, a plurality of through holes 14b of the spacing ring 14A are formed around the circumferential direction to flow the nitrogen gas. On the other hand, with the third embodiment, as shown in FIG. 6, a first through hole 34a and a second through hole 34b are formed apart in the optical axis direction in a spacing ring (impingement member) 34, to thereby dispersingly introduce the nitrogen gas.

That is to say, in the third embodiment, it is not necessary to form a circulation groove around the circumferential direction in the spacing ring 34, and the construction may be such that a circulation groove 34c need only be formed on a part of the spacing ring 34. That is, the circulation groove 34c is formed on the external face of the spacing ring 34 so as to communicate the inlet 15c formed on the lens-barrel 15, with a first through hole 34a and a second through hole 34b.

According to the present embodiment, since the position of the inlet 15c and the first and second through holes 34a, 34b are shifted, the nitrogen gas supplied to a space between the outer circumference of the spacing ring 34 and the inner circumference of the lens-barrel 15 impinges against the outer circumference A of the spacing ring 34 (circulation groove 34c) to decrease the flow rate. Then, the nitrogen gas is supplied from the circulation groove 34c via the first and second through holes 34a and 34b into the lens-barrel 15.

Therefore, the nitrogen gas is decelerated by the circulation groove 34c, and dispersed to flow from the first and second through holes 34a and 34b. Hence the surface of the lens L2 is not tarnished.

The number of through holes may be plural or single. If a plurality of through holes are used, as described above, the nitrogen gas can be dispersingly introduced, so that tarnishing of the lens can be further decreased compared to a case where only one through hole is used.

Figure 4:
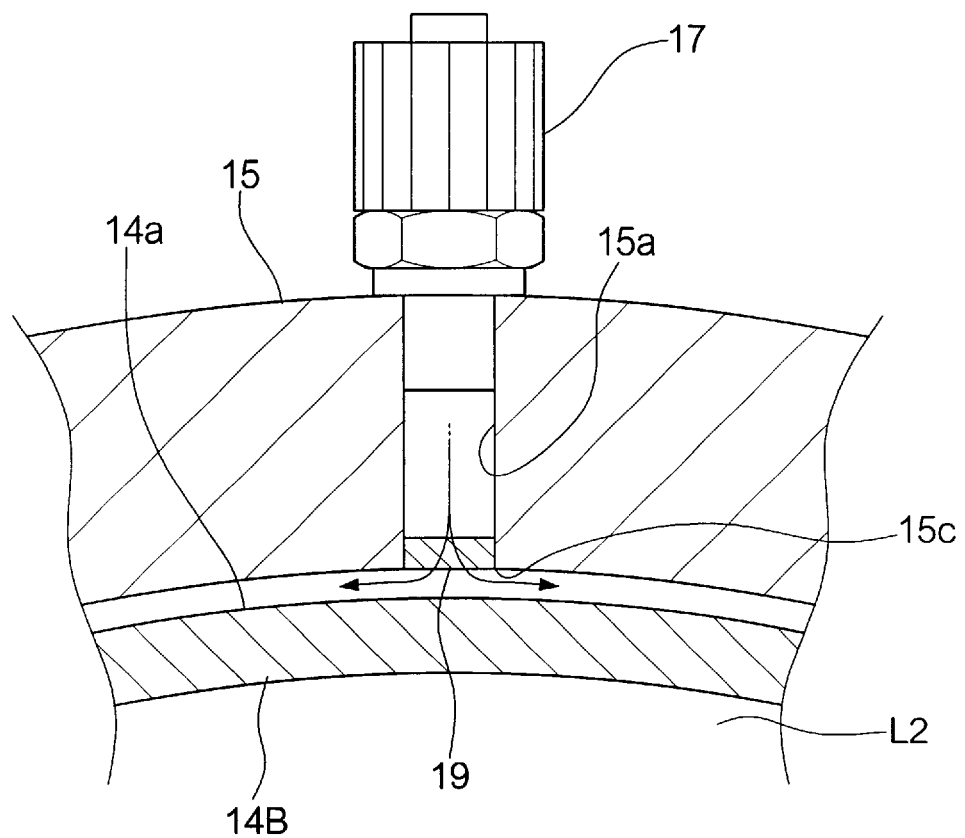
FIG. 4 is an enlarged sectional view of a part of a lens-barrel and spacing rings in a modified example of the first embodiment of the present invention.

As a modified example of the first embodiment shown in FIG. 3, when the nitrogen gas from the gas supply device 16 is introduced into the lens-barrel 15, in order to remove dirt from the piping which has become mixed into the gas, between the gas supply device 16 and the inflow joint 17, then as shown in FIG. 4, a filter 19 may be provided in the inlet 15c for absorbing impurities in the nitrogen gas by circulating the inflow nitrogen gas. As described above, by providing the filter 19 in the inlet 15c, the flow rate of the nitrogen gas can be further decreased. In each embodiment shown in FIG. 5 and FIG. 6, the nitrogen gas from the gas supply device 16 is directly introduced into the lens-barrel 15. However, the above filter may be provided in the inlet 15c.

In the case of the first embodiment, the filter 19 may be provided in any passage from the inflow joint 17 to the through hole 14b. For example, it may be provided in each through hole 14b. If the filter 19 is provided, the inlet 15c and the through hole 14b may be arranged to face each other, to introduce the nitrogen gas from the inlet 15c into the lens-barrel, without letting it impinge against the spacing ring. That is to say, the filter 19 can play a role for decreasing the flow rate of the nitrogen gas. Moreover, in the case of the second and third embodiments, the filter 19 may be respectively provided in the through hole 24a, and in the first and second through holes 34a and 34b.

The plurality of through holes 14b of the spacing ring 14A are formed in the circumferential direction. However, if there is room in the width of the spacing ring, a plurality of through holes may be formed also in the axial direction. In this case, the nitrogen gas can be dispersed due to the plurality of through holes, and made to flow between the lenses at a low flow rate.

Moreover, if the spacing between lenses can be made large, it is preferable to form the through hole 14b in such a manner that the lens surface is not located on the extension line of the through hole 14b so long as this arrangement is permitted, so that as much as possible, the nitrogen gas flowing from the through hole 14b does not impinge on the lens surface.

With the first embodiment, the circulation groove 14a and the plurality of through holes 14b are formed in the spacing ring 14A, so that the gas is supplied from one gas inlet to in-between the lenses via the circulation groove 14a and through holes 14b. However, a plurality of gas inlets may be formed on the lens-barrel 15, so that the gas is supplied from these gas inlets to in-between the lenses via the above-described circulation groove 14a and through holes 14b.

Moreover, a ring-form piping may be arranged on the lens-barrel 15 instead of the circulation groove 14a. That is to say, piping connected to the gas supply device may be connected on the outer circumference side of the ring-form piping, and a plurality of gas inlets may be formed on the inner circumference side of the ring-form piping. In this case, the plurality of gas inlets formed on the inner circumference side are shifted and formed so as not to face the opening of the piping connected to the outer circumference side. If the spacing ring 14A in the first embodiment is used, the above described piping is not necessary.

In the first embodiment, the description has been for the case where the space between the lens L1 and the lens L2, and the space between the lens L2 and the lens L3 are connected with the connection groove 15e. However, the space between the lens L1 and the lens L2 and the space between the lens L2 and the lens L3 may be independent for flowing the nitrogen gas. In this case, the inlet hole 15a and the outlet hole 15b may be formed on the lens-barrel 15 constituting a part of each space, with the inlet joint 17 provided for the inlet hole 15a, and the outlet joint 18 provided for the outlet hole 15b for each part.

In the above described embodiments, a filter is used for decreasing the flow rate of the nitrogen gas. As this filter, there can be used at least one of a HEPA filter (High Efficiency Particulate Air-filter) or a ULPA filter (Ultra Low Penetration Air-filter) for removing impurities such as dust, water or the like, and a chemical filter for removing chemical substances.

For example, as a chemical filter, there can be used an activated carbon filter (for example, "Giga Soap" manufactured by Nitta Ltd. of Japan) or a zeolite filter, for removing ammonia, amine type compounds, organic compounds of sulfur type or silicon type such as siloxane, silazane, silanol or the like, and impurities such as plasticizers (for example, phthalic acid ester), flame retardants (phosphoric acid, chlorine-type substances) or the like.

As described above, by supplying the gas into the casing via at least one of the chemical filter, the HEPA filter and the ULPA filter, contamination of the optical members in the casing, for example, the lens surface, mirror surface or the like can be reduced.

For example, when an exposure light in the range of wavelength not higher than 190 nm is used in the exposure apparatus, if impurities generated by the piping itself (for example, water molecules, hydrocarbon molecules, or substances absorbing the exposure light other than these molecules) intrude into the casing, these may adhere to the surface of the optical members, causing variation in the transmissivity and reflectivity of the optical system. Moreover, the exposure light is absorbed by the water molecules and substances absorbing the exposure light, to change the strength of the exposure light on the wafer face, causing changes in the exposure quantity on the wafer face. However, if as described above, the gas is passed through the filter before being blown onto the optical members, variation in the transmissivity and reflectivity of the optical system and changes in the strength of the exposure light can be suppressed.

In the above described each embodiment, nitrogen gas is used as the gas to be supplied. However an inert gas such as helium, neon, argon, krypton, xenon, radon or the like may be used. If the wavelength of the exposure light is that of KrF, chemically clean dry air (air in which substances causing tarnishing of the lenses, for example, ammonia ions floating in a clean room, have been removed, or air having a humidity of not higher than 5%) may be used.

Moreover, in the above described respective embodiments, it is desirable to use for the piping arranged between the gas supply device 16 and the inflow joint 17, a material in which the generation of impurity gases is suppressed (reduced), such as a stainless steel pipe, Teflon tube or the like. It is desirable that the spacing ring and lens-barrel are also formed of a stainless steel material, or that an aluminum material coated with Teflon is used.

The exposure apparatus in the above described embodiment can be applied to a proximity exposure apparatus where the projection optical system is not used, and instead of the reticle, the mask and the substrate are placed in proximity to each other, to expose the mask pattern.

The application of the exposure apparatus is not limited to an exposure apparatus for producing semiconductors, and for example, the invention can be widely applied to exposure apparatus for liquid crystals which expose a liquid crystal display device pattern on a square glass plate, or to exposure apparatus for producing thin-film magnetic heads.

In this embodiment, the light source for the exposure apparatus may be a light source of a g-line (436 nm), an i-line (365 nm), a KrF excimer laser (248 nm), an ArF excimer laser (193 nm), an $F_2$ laser (157 nm), or one having a wavelength shorter than these. Moreover, the present invention can be applied to an exposure apparatus using charged particle rays such as X rays or an electron beam. For example, for the construction of the exposure apparatus using the electron beam this may be such that a thermionic emission type lanthanum hexaboride ($LaB_6$) or tantalum (Ta) is used as the electron gun, and as the optical system at that time, an electron optical system comprising an electron lens and a deflector is used. In addition, the optical path through which the electron beam passes is made a vacuum.

The magnification of the projection optical system may involve not only a reduction system but may also involve an equal magnification or enlarging system.

As the projection optical system, when far-ultraviolet rays such as with an excimer laser are used, a material which transmits far-ultraviolet rays, such as quartz or fluorite, is used as the glass material, and when an $F_2$ laser or X rays are used, a reflection/refraction system or a refraction system is used as the optical system (a reflection type reticle is also used). Furthermore, when an electron beam is used, the electron optical system comprising an electron lens and a deflector may be used as the optical system. The optical path through which the electron beam passes is made a vacuum.

When a linear motor is used for the wafer stage or the reticle stage (see U.S. Pat. No. 5,623,853 or U.S. Pat. No. 5,528,118), either of an air floating type using an air bearing, or a magnetic levitation type using Lorentz force or reactance force may be used.

Moreover, the stage may be a type which moves along a guide, or a guideless type without a guide.

The reaction force generated by the movement of the wafer stages may be removed mechanically to the floor (ground) using a frame member, as described in U.S. Pat. No. 5,528,118.

The reaction force generated by the movement of the reticle stage may be removed mechanically to the floor (ground) using a frame member, as described in U.S. patent application Ser. No. 416558.

As described above, the exposure apparatus of the present invention is produced by assembling various sub-systems including respective constituents described above, so as to maintain a predetermined mechanical precision, electrical precision and optical precision. To ensure these various precisions, there are performed adjustments for obtaining the optical precision with respect to various optical systems, adjustments for obtaining the mechanical precision with respect to various mechanical systems and adjustments for obtaining the electrical precision with respect to various electrical systems, prior to assembly. The assembly process from various sub-systems to the exposure apparatus includes mechanical connection, wiring connection of electrical circuits and piping connection of pneumatic circuits between various sub-systems. Prior to the assembly process from various sub-systems to the exposure apparatus, there is an assembly process for each sub-system. After the assembly process from various sub-systems to the exposure apparatus has been completed, comprehensive adjustment is performed, to thereby ensure various precisions for the overall exposure apparatus. In addition, it is desirable that the production of the exposure apparatus be performed in a clean room wherein the temperature, the degree of cleanliness and the like are controlled.

A semiconductor device is produced through steps such as: a step for designing the function and performance of a device, a step for producing reticles based on the designing step, a step for producing wafers from a silicon material, a step for exposing a pattern of a reticle onto a wafer by means of the exposure apparatus in the above described embodiment, a device assembly step (including a dicing step, a bonding step and a packaging step), and an inspection step.

What is claimed is:

1. An optical apparatus comprising:
    an optical member;
    a casing containing said optical member and in which is formed a gas supply opening; and
    a gas introduction mechanism disposed between said optical member and said gas supply opening, which changes a flow of said gas so that said gas supplied via said gas supply opening does not blow directly onto a surface of said optical member.

2. An optical apparatus according to claim 1, wherein said gas introduction mechanism is attached inside said casing.

3. An optical apparatus according to claim 2, wherein said gas introduction mechanism comprises an impingement member against which said gas supplied via said gas supply opening impinges.

4. An optical apparatus according to claim 1, wherein said gas introduction mechanism comprises an annular member arranged in said casing so as to surround said optical member, and in said annular member, there is formed a circulation groove formed around a circumferential direction, in a face facing said gas supply opening formed in said casing, and a plurality of through holes arranged circumferentially apart from each other, along said circulation groove.

5. An optical apparatus according to claim 4, wherein said through holes are arranged at positions shifted from said gas supply opening.

6. An optical apparatus according to claim 4, wherein said annular member is disposed between adjacent said optical members for regulating a spacing of these optical members.

7. An optical apparatus according to claim 1, wherein a filter is provided in said gas supply opening that adsorbs impurities in said gas supplied via said gas supply opening.

8. An exposure apparatus which guides exposure energy to a mask to thereby form a pattern on said mask onto a substrate, said apparatus comprising said optical apparatus of claim 1, and wherein at least one of an optical system that guides said exposure energy to said mask, and an optical system that guides said pattern to said substrate, is constructed by said optical members in said optical apparatus.

9. An exposure apparatus which guides exposure energy to a mask to thereby form a pattern on said mask onto a substrate, said apparatus comprising said optical apparatus of claim 3, and wherein at least one of an optical system that guides said exposure energy to said mask, and an optical system that guides said pattern to said substrate, is constructed by said optical members in said optical apparatus.

10. A gas introduction method used in an exposure apparatus which guides exposure energy to a mask to thereby form a pattern on said mask onto a substrate, wherein:

said exposure apparatus comprises a casing containing an optical member and in which is formed a gas supply opening, and gas supplied to inside said casing from a gas supply device is supplied via said gas supply opening, and when said gas is supplied to inside said casing via said gas supply opening, a flow of said gas is changed using a gas introduction mechanism so that said gas does not blow directly onto a surface of said optical member.

11. A gas introduction method according to claim 10, wherein said optical member constitutes at least one of an optical system that guides said exposure energy to said mask, and an optical system that guides said pattern to said substrate.

12. A gas introduction method according to claim 10, wherein said gas introduction mechanism comprises an impingement member attached inside said casing against which said gas supplied via said gas supply opening impinges.

13. A gas introduction method according to claim 10, wherein said gas supplied via said gas supply opening is supplied to inside said casing from a plurality of places around said optical member by said gas introduction mechanism.

14. A gas introduction method according to claim 13, wherein impurities contained in said gas are removed by a filter provided in said gas supply opening.

15. A gas introduction method according to claim 14, wherein impurities contained in said gas are organic compounds generated from piping connecting said gas supply device to said casing.

16. An optical apparatus according to claim 1, further comprising:

gas supply device connected to said casing and which supplies said gas, and a filter that removes impurities generated between said gas supply device and said casing.

17. An optical apparatus according to claim 16, wherein said gas supply device supplies an inert gas in a predetermined concentration.

18. An optical apparatus according to claim 2, wherein said gas introducing mechanism supplies said gas supplied via said gas supply opening from a plurality of places around said optical member.

* * * * *